US006267817B1

(12) United States Patent
Gonzalez

(10) Patent No.: US 6,267,817 B1
(45) Date of Patent: *Jul. 31, 2001

(54) METHODS OF FORMING SEMICONDUCTOR WAFERS, METHODS OF TREATING SEMICONDUCTOR WAFERS TO ALLEVIATE SLIP GENERATION, INGOTS OF SEMICONDUCTIVE MATERIAL, AND WAFERS OF SEMICONDUCTIVE MATERIAL

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/548,036

(22) Filed: Apr. 12, 2000

Related U.S. Application Data

(63) Continuation of application No. 08/918,705, filed on Aug. 22, 1997, now Pat. No. 6,059,879.

(51) Int. Cl.[7] .................................................. C30B 25/18

(52) U.S. Cl. ................................. 117/92; 117/94; 117/95; 117/935; 438/524; 438/694; 216/17; 216/39

(58) Field of Search ...................... 438/524, 694; 216/17, 39; 117/92, 94, 95, 935

(56) References Cited

U.S. PATENT DOCUMENTS

| 4,737,468 | 4/1988 | Martin | 437/26 |
|---|---|---|---|
| 5,196,358 | 3/1993 | Boos | 437/40 |

FOREIGN PATENT DOCUMENTS 2-114534   4/1990   (JP) .

OTHER PUBLICATIONS

Noboro Akiyama, et al., Critical Radial Temperature Gradient Inducing Slip Dislocations in Silicon Epitaxy Using Dual Heating of the Two Surfaces of a Wafer, *Japanese Journal of Applied Physics*, vol. 15, Mo. 11, Nov. 1986, pp. 1619–1622.

Masaharu Watanabe, Technical Trends in Large Diameter Silicon Wafers: Part II, *Solid State Technology*, Apr. 1991, pp. 133–142.

J. S. Simon, et al., Influence of oxygen on the recombination strength of dislocations in silicon wafers, *Materials Science and Engineering* B36 (1996), pp. 183–186.

(List continued on next page.)

Primary Examiner—Robert Kunemund
(74) Attorney, Agent, or Firm—Wells, St. John, Roberts, Gregory & Matkin, P.S.

(57) ABSTRACT

The invention encompasses methods of treating semiconductive material wafers and ingots to alleviate slippage within monocrystalline lattices of the wafers and ingots. The invention further encompasses monocrystalline semiconductive material wafers and monocrystalline semiconductive ingots which are treated to alleviate slippage within a crystalline lattice of the wafers and ingots. In one aspect, the invention includes a method of forming a semiconductive material wafer comprising: a) forming an ingot of semiconductive material, said ingot comprising an outer periphery; b) forming a wafer from the ingot, the wafer comprising said outer periphery; and c) doping said outer periphery with strength-enhancing dopant atoms. In another aspect, the invention includes a method of forming a semiconductive material wafer comprising: a) forming an ingot of semiconductive material, said ingot comprising an outer periphery; b) implanting a stacking fault inducing material into the ingot to form stacking faults proximate the outer periphery of the ingot; and c) forming a wafer from the ingot, the wafer comprising the stacking faults. In another aspect, the invention includes an ingot of semiconductive material comprising: a) an outer periphery region which comprises an outer boundary of the ingot; and b) strength-enhancing dopant atoms provided within the outer periphery region.

25 Claims, 4 Drawing Sheets

OTHER PUBLICATIONS

Y. K. Kim, et al., Factors Affecting the Formation of Oxidation–Induced Stacking Fault Nuclei in Silicon Crystals Grown With Czochralski Method, Abstract No. 186, pp. 257–258.

A. Buczkowski, et al., Surface Recombination Velocity and Recombination Lifetime in Iron Contaminated Silicon, Department of Materials Science and Engineering, Abstract No. 291, pp. 478–479.

J. R. Patei, et al., Oxygen precipitation and stacking–fault formation in dislocation–free silicon, *J. Appl. Phys.* 48 (12), Dec. 1977, pp. 5279–5288.

Cor L. Claeys, et al., The Influence of annealing ambient on the shrinkage kinetics of oxidation–induced stacking faults in silicon, *Appl. Phys. Lett.* 35(10), Nov. 1979, pp. 797–798.

G. A. Rozganyi, et al. The Elimination of Stacking Faults by Preoxidation Gettering of Silicon Wafers, III. Defect Etch Pit Correlation wit p–n Junction Leakage, *J. Electrochem. Soc.: Solid–State Science and Technology*, Apr. 1976, pp. 570–576.

H.D. Chiou, et al., Effects of Oxygen and Nitrogen on Slip in Z Silicon Wafers, *VLSI Science and Technology*, 1984, pp. 58–65.

Defects and Radiation Effects in Semiconductors, 1980, Invited and contributed papers from the Eleventh International Conference on Defects and Radiation Effects in Semiconductors held in Oiso, Japan, Sep. 1980, pp. 400–407.

J.–P. Zollner, et al., Slip Generation during Rapid Thermal Processing, *Phys. Stat. Sol.* (a) 156 (1996), pp. 63–70.

Fredric Ericson, et al., Micromechanical fracture strength of silicon, *J. Appl. Phys.* 68(11), Dec. 1990, pp. 5840–5844.

A. Misiuk, et al., Stress–induced oxygen precipitation in Cz–Si, *Elsevier Materials Science and Engineering* B36 (1996), pp. 30–32.

K. N. Ritz, et al., Observation of slip dislocations in (100) silicon wafers after $BF_2$ ion implantation and rapid internal annealing, *J. Appl. Phys.* 60 (2) Jul. 1986, pp. 800–802.

K. N. Ritz, et al., Observation of Slip Dislocation in (100) and (111) Silicon Wafers After Rapid Thermal Processing, Abstract No. 462, pp. 665–666.

Hirofumi Shimizu, et al., Thermal Warpage of Large Diameter Czochralski–Grown Silicon Wafers, *J. Applied Phys.*, Dec. 1988, pp. 2315–2323.

Anthony E. Stephens, Plastic Deformation of 200 MM Silicon Wafers During Furnace Insertion and Withdrawal, Proceedings of the Second Symposium on Defects in Silicon, pp. 389–397.

M. Porrini, et al., Influence of thermal history during Czochralski silicon crystal growth on OISE nuclei formation, *Elsevier Materials Science and Engineering* B36 (1996), pp. 162–166.

B. Leroy, et al., Warpage of Silicon Wafers, *J. Electrochem. Soc.*, vol. 127, No. 4, pp. 961–969 (1980).

Kim Young Kwan, Factors Affecting the Formation of the OISE Nuclei in the Silicon Crystal Grown by the CZ Process, , Lucky Advanced Materials, Inc., Abstract No. 428.

Fumio Shimura, Semiconductor Silicon Crystal Technology, Academic Press, pp. 279–377.

Jan Raebiger, et al., Carrier lifetime and x–ray imaging correlations of an oxide–induced stacking fault ring and its gettering behavior in Czochralski silicon, *App. Phys. Lett.* 69 (20), Nov. 11, 1996.

Kieran Marsden, et al., Determination of the criteria for nucleation of ring–OSE from small as–grown oxygen precipitates in CZ–Si crystals, *Materials Science and Engineering* B36 (1996), pp. 16–21.

K. Sumino, Defect Control in Semiconductors, Proceedings of the International Conference on the Science and Technology of Defect Control in Seminconductors, the Yokohama 21st Century Forum, Yokohama, Japan, Sep. 1989, pp. 157–161.

P. Yang, et al., Dislocation contrast in X–ray section and projection topography of elastically deformed crystals, Inst. Phys. Conf. Ser No. 100, Section 6, paper presented at Microse Semicond. Mater, Oxford, Apr. 1989, pp. 467–471.

S. M. Hu, Dislocations in thermally stressed silicon wafers, *Appl. Phys. Lett.*, vol. 22, No. 5, Mar. 1, 1973, pp. 261–264.

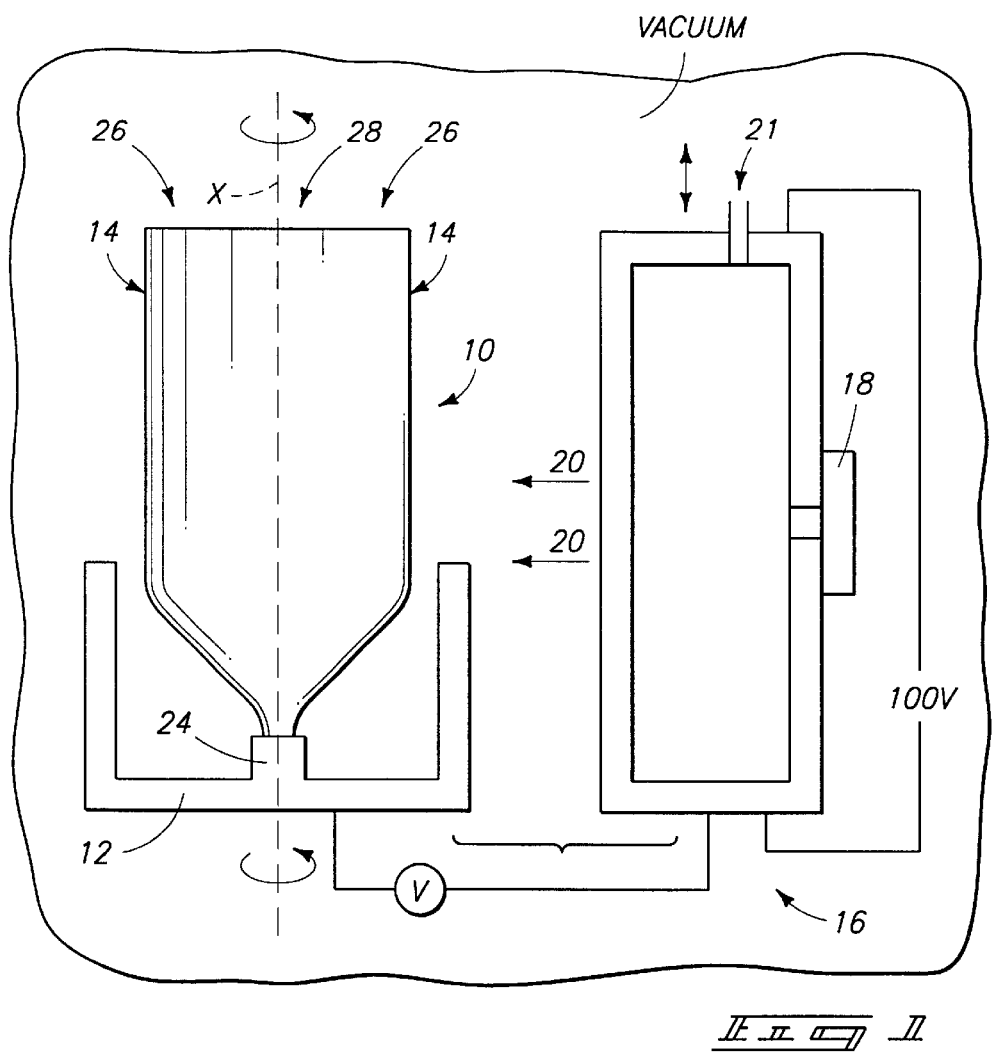
_Fig. 1_
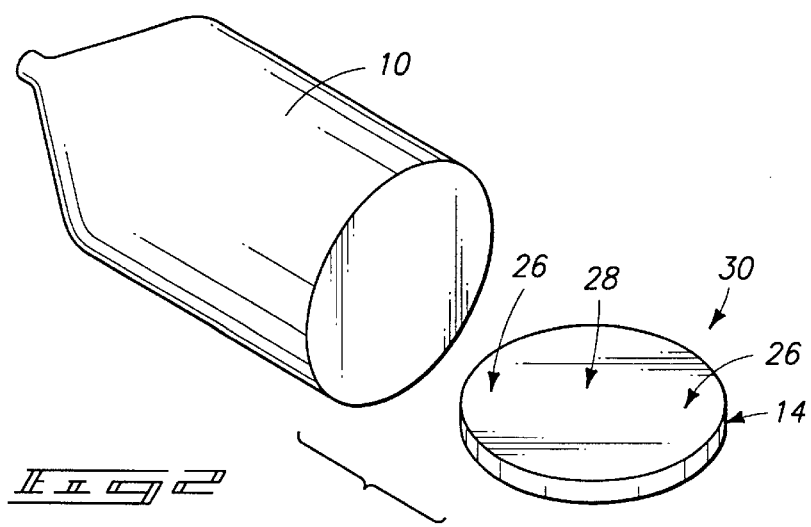
_Fig. 2_

METHODS OF FORMING SEMICONDUCTOR WAFERS, METHODS OF TREATING SEMICONDUCTOR WAFERS TO ALLEVIATE SLIP GENERATION, INGOTS OF SEMICONDUCTIVE MATERIAL, AND WAFERS OF SEMICONDUCTIVE MATERIAL

RELATED PATENT DATA

This patent resulted from a continuation application of U.S. patent application Ser. No. 08/918,705, which was filed on Aug. 22, 1997 now U.S. Pat. No. 6,059,879.

TECHNICAL FIELD

The invention pertains to methods of forming semiconductive wafers, and to methods of alleviating slip generation within semiconductive wafers. The invention further pertains to methods of forming semiconductive ingots. Additionally, the invention pertains to semiconductive material ingots and to semiconductive material wafers.

BACKGROUND OF THE INVENTION

Semiconductive wafers are used as substrates for the formation of microprocessor, DRAM, logic, and memory circuits. Such semiconductive wafers can comprise, for example, silicon. Ideally, the semiconductive wafers will comprise a single crystal of semiconductive material. For instance, silicon wafers are generally taken from crystals grown by a Czochralski (CZ) method or a float zone (FZ) method. The CZ method comprises growing a crystalline ingot by dipping a seed crystal into a silicon melt and then slowly extracting the seed. Liquid from the silicon melt crystallizes on the seed as it is extracted. Preferably, oxygen and other impurities will be excluded as the silicon melt is crystallized. Otherwise, the impurities can become incorporated into the silicon crystal during growth and cause defects in the crystalline lattice. For instance, if oxygen is introduced during cooling of a silicon melt, an oxygen-induced stacking fault (OSF) will typically result. Such OSF can adversely affect circuit devices formed on the crystalline silicon if the fault moves to a surface of the silicon.

After formation of the semiconductive ingot, the ingot is cut into thin wafers. The wafers are then subjected to further processing to form integrated circuitry on them.

The processing to form integrated circuitry on the silicon wafer generally involves various heating and cooling steps. Such steps cause the wafer to radially expand and contract. The degree of expansion and contraction are frequently not equal at the center of the wafer relative to regions of the wafer more adjacent a radially outer periphery of the wafer. Such unequal or uneven expansion of regions of the wafer can result in sheer stress between vertically stacked planes of the crystalline lattice. As sheer stress can lead to adjacent planes in the crystalline lattice slipping or sliding relative to one another, the sheer stress can upset the monocrystalline lattice of the silicon wafer. Such slippage of the planes in the crystalline lattice is referred to herein as "slip generation". Upsets in the lattice of the wafer can generate defects which adversely affect integrated circuits subsequently formed on the wafer.

A continuing trend in semiconductor wafer processing is to utilize larger and larger diameter wafers. Problems associated with lattice slipping are expected to become more pronounced as wafers become ever larger.

It would be desirable to develop methods for avoiding generation of lattice slippage in wafers, and to develop monocrystalline semiconductive material wafers and ingots treated to alleviate slippage within the crystalline lattices of the wafers and ingots.

SUMMARY OF THE INVENTION

The invention encompasses methods of treating semiconductive material wafers and ingots to alleviate slippage within monocrystalline lattices of the wafers and ingots. The invention further encompasses monocrystalline semiconductive material wafers and monocrystalline semiconductive ingots which are treated to alleviate slippage within a crystalline lattice of the wafers and ingots.

In one aspect, the invention includes a method of forming a semiconductive material wafer wherein an ingot of semiconductive material is formed, and wherein the ingot comprises an outer periphery. A wafer is formed from the ingot, and the wafer comprises the outer periphery. The outer periphery is doped with strength-enhancing dopant atoms.

In another aspect, the invention includes a method of forming a semiconductive material wafer wherein an ingot of semiconductive material is formed, and wherein the ingot comprises an outer periphery. A stacking fault and inducing material is implanted into the ingot to form stacking faults proximate the outer periphery of the ingot. The stacking fault inducing material can be an oxygen precipitant inducing material. A wafer is formed from the ingot, and the wafer comprises the stacking faults. If the stacking fault inducing material is an oxygen precipitant inducing material, the wafer can also comprise oxygen precipitants.

In another aspect, the invention includes a method of treating a semiconductive material wafer to alleviate slip generation wherein a portion of the wafer is masked to form a masked portion and an unmasked portion of the wafer. While masking the wafer, stacking faults are formed in the unmasked portion of the semiconductive material wafer.

In another aspect, the invention includes an ingot of semiconductive material having an outer periphery region which defines an outer boundary of the ingot, and having stacking faults formed within the outer periphery region.

In another aspect, the invention includes a wafer of semiconductive material having an outer periphery which comprises a peripheral edge at an outer boundary of the wafer. Strength-enhancing dopant atoms are provided within the outer periphery region such that a peak depth of the strength-enhancing dopant atoms is from about 0.3 microns to about 3 microns from the peripheral edge of the wafer.

BRIEF DESCRIPTION OF THE DRAWINGS

Preferred embodiments of the invention are described below with reference to the following accompanying drawings.

FIG. 1 illustrates a diagrammatic side view of monocrystalline semiconductive material ingot being treated according to a first embodiment method of the present invention.

FIG. 2 is a perspective view of FIG. 1 ingot showing the ingot being cut into wafers.

DETAILED DESCRIPTION OF THE PREFERRED EMBODIMENTS

Figure 3:
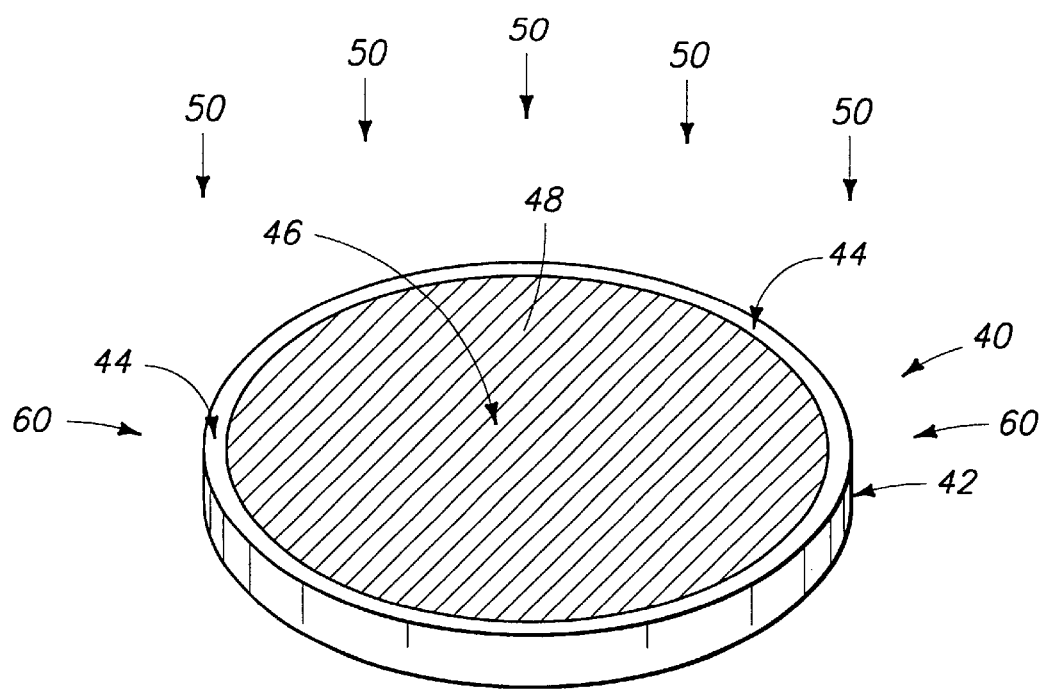
FIG. 3 is a diagrammatic perspective view of a monocrystalline semiconductive material wafer being treated according to a second embodiment method of the present invention.

This disclosure of the invention is submitted in furtherance of the constitutional purposes of the U.S. Patent Laws "to promote the progress of science and useful arts" (Article 1, Section 8).

A first embodiment method of the present invention is described with reference to FIGS. 1 and 2. FIG. 1, illustrates an ingot 10 of semiconductive material being held in a ingot support device 12. Ingot 10 may be formed by conventional methods, such as the CZ method discussed above regarding the prior art. Ingot 10 can comprise a number of semiconductive materials, including, for example, silicon or germanium. Ingot 10 comprises an outer periphery 14 which defines an outer boundary of ingot 10. Ingot 10 is placed within a vacuum chamber. An ion implanting device 16 is provided adjacent ingot 10. Implanting device 16 comprises a source housing 18. A gas 21 is flowed into device 16 and ions 20 are generated from gas 21. Ions 20 are implanted into ingot 10 to eventually cause stacking faults proximate outer periphery 14.

In one aspect of the present invention, it is recognized that "slip generation" propagation appears to occur from radially outward to radially inward within a semiconductive material ingot or wafer. Accordingly, if slip generation can be stopped at about outer periphery 14, slip generation may be prevented from occurring at all within a semiconductive material ingot 10, or a wafer formed from semiconductive material ingot 10. The formation of stacking faults proximate outer periphery 14 is thought to alleviate initial formation of slip generation regions within outer periphery 14, and to thereby prevent slip generation propagation from occurring throughout ingot 10.

Preferably, ions 20 comprise strength-enhancing dopant atoms selected from the group consisting of oxygen atoms, germanium atoms, nitrogen atoms and carbon atoms. In various aspects of the present invention, the preferred strength-enhancing dopant atoms can consist a essentially of oxygen atoms, carbon atoms, germanium atoms or nitrogen atoms. If ions 20 comprise oxygen atoms, ions 20 can generate oxygen precipitants proximate outer periphery 14. Such oxygen precipitants can induce the above-discussed stacking faults.

Semiconductive material ingot 10 comprises an exposed surface at outer periphery 14. Preferably, strength-enhancing dopant atoms 20 are implanted to a peak depth of from about 0.3 microns to about 3 microns below such exposed surface of semiconductive material ingot 10. Such implanting of dopant atoms 20 can be accomplished by implanting the atoms at an energy of from about 200 keV to about 3 Mev and at a dose of from $5 \times 10^{14}$ to $1 \times 10^{16}$ atoms/cm$^2$.

In one aspect of the present invention, at least one of the ingot 10 and the implant source 16 is displaced relative to the other of the ingot 10 and the implant source 16 during implanting of dopant 20. Such displacement enables dopant 20 to be implanted substantially uniformly across a predominate portion of outer periphery 14.

Several methods of displacing ingot 10 relative to implant device 16 will be recognized by persons of ordinary skill in the art. For instance, ingot support device 12 can comprise a spindle 24 which rotates ingot 10 relative to ion implant source 16. Also, ion implant source 16 can be mounted on a mechanism (not shown) for rotating device 16 about ingot 10.

Additionally, the displacement of the ingot or implant source can include moving at least one of the ingot or implant source longitudinally relative to the other of the ingot or implant source. For instance, as shown in FIG. 1 ingot 10 comprises a longitudinal axis "X". The invention encompasses methods in which ingot 10 is displaced along axis "X" relative to ion implant device 16, methods in which device 16 is displaced along longitudinal axis "X" relative to ingot 10, and methods in which both ingot 10 and device 16 are displaced along longitudinal axis "X" relative to one another.

Additional methods of displacing ingot 10 and device 16 relative to one another include rotating at least one of ingot 10 and device 16 relative to the other ingot 10 and device 16, and, simultaneously, longitudinally displacing at least one of ingot 10 and device 16 along axis "X" relative to the other of ingot 10 and device 16.

After doping of ingot 10 with strength-enhancing dopant atoms 20, ingot 10 preferably comprises a doped exterior region 26, which preferably includes periphery 14, and an undoped interior region 28 radially inward of exterior region 26. Doped exterior region 26 may alternatively be referred to as a doped peripheral region 26.

In a further aspect of the invention, ingot 10 may be subjected to thermal processing after doping with strength-enhancing dopant atoms 20. Such thermal processing enhances the formation of stacking faults within exterior region 26 and proximate periphery 14. The thermal processing may comprise, for example, subjecting doped region 26 of ingot 10 to a temperature of at least about 800° C. for a time of at least about two hours. Preferably, the thermal processing with comprise subjecting doped region 26 of ingot 10 to a temperature of about 1,000° C. for a time of about four hours.

Referring to FIG. 2, ingot 10 is cut to form a wafer 30. Accordingly, wafer 30 comprises outer periphery 14 and doped exterior region 26. Wafer 30 may be formed either before or after the above-discussed thermal processing of doped region 26. Wafer 30 formed by the first embodiment of the present invention advantageously comprises strength-enhancing dopant atoms within peripheral region 26. Such strength-enhancing dopant atoms preferably form stacking faults within peripheral region 26 which alleviate slip generation throughout wafer 30.

The above-described first embodiment comprises doping of an exterior region 26 of a semiconductive material ingot 10 prior to forming a wafer 30 from the ingot 10. Alternative embodiments of the invention are next described which comprise doping a wafer after slicing the wafer from an ingot.

A second embodiment of the present invention is described with reference to FIG. 3. In FIG. 3, a wafer 40 is shown. Wafer 40 comprises an outer periphery 42, a radially outer region 44, and a radially inner region 46. A portion of wafer 40 comprising radially inner region 46 is masked with a masking material 48. Masking material 48 can comprise, for example, photoresist. Masking material 48 defines a masked portion of wafer 40 comprising radially inner region 46, and an unmasked portion of wafer 40 comprising radially outer region 44. Masked wafer 40 is implanted with a dopant 50 to form stacking faults in the unmasked portion.

For reasons similar to those discussed above regarding the first embodiment of the invention, such stacking faults are thought to alleviate slip generation in outer region 44 and to thereby alleviate slip generation throughout wafer 40.

Dopant 50 preferably comprises a strength-enhancing dopant, such as a dopant atom selected from the group consisting of oxygen atoms, germanium atoms, nitrogen atoms and carbon atoms.

Periphery 42 of wafer 40 defines an outer edge of wafer 40 and may be referred to as edge 42. In a further embodiment of the invention, a strength-enhancing dopant 60 may be implanted through edge 42 and into a portion of radially outer region 44 proximate to edge 42. Dopant 60 will preferably comprise one or more of the preferred strength-enhancing dopant atoms discussed above regarding dopant 50. It is noted that the present invention encompasses embodiments in which either or both of the implant of dopant 50 from elevationally above wafer 40 and the implant of dopant 60 from radially outward of wafer 40 are performed.

Figure 4:
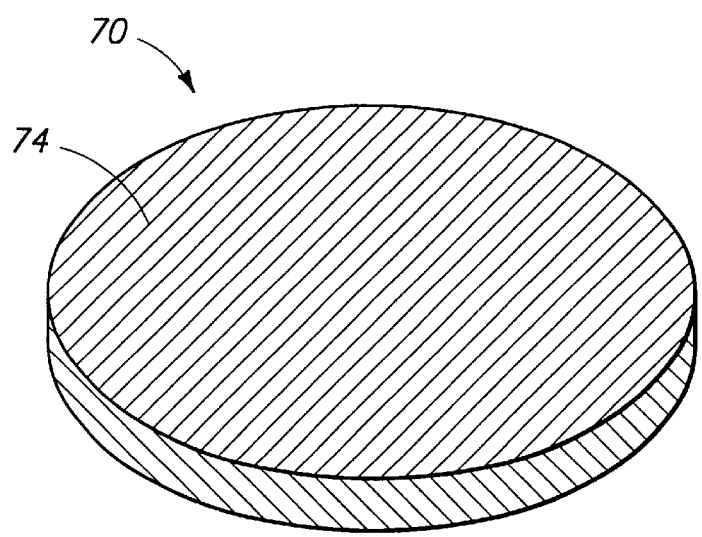
FIG. 4 is a diagrammatic perspective view of a monocrystalline semiconductive material wafer being treated according to a third embodiment method of the present invention.

A third embodiment of the present invention is described with reference to FIGS. 4–8. Referring to FIG. 4, a wafer 70 is illustrated. Wafer 70 comprises a semiconductive material 72 (shown in FIG. 5) coated with a layer of photoresist 74. Photoresist layer 74 may be formed by conventional methods. Preferably, photoresist layer 74 is formed at an initial stage of wafer processing as part of a process to form alignment markings on the wafer. Such alignment markings may be utilized at later processing steps to enable, for example, precise alignment of photolithographic masks.

Figure 5:
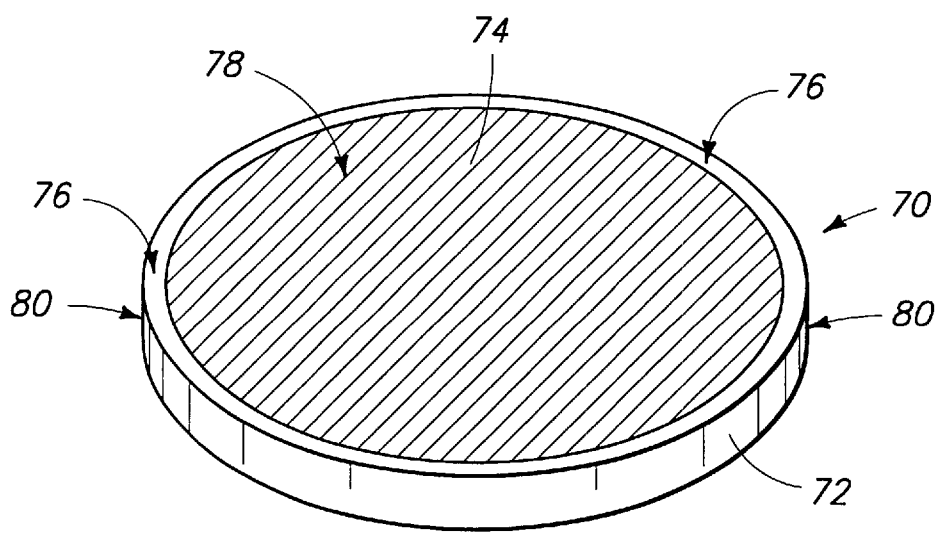
FIG. 5 shows the wafer of FIG. 4 at a processing step subsequent to that of FIG. 4.

Referring to FIG. 5, a portion of photoresist layer 74 is removed to expose semiconductive material 72 of wafer 70. Preferably, the removal of a portion of photoresist layer 74 exposes a radially outer region 76 of wafer 70 while leaving a radially inner region 78 of wafer 70 masked with photoresist layer 74. Also, the removal of photoresist layer 74 preferably exposes an outer periphery 80 of wafer 70. A preferred method of removing such portion of photoresist layer 74 is with an edge bead removal (EBR) ring. Such use of an edge bead removal ring is typical in preliminary wafer processing steps to form an exposed region 80 which may be grasped by wafer manipulation devices. The formation of exposed outer periphery 80 thus advantageously does not require addition of an extra step to conventional processing methods.

Figure 6:
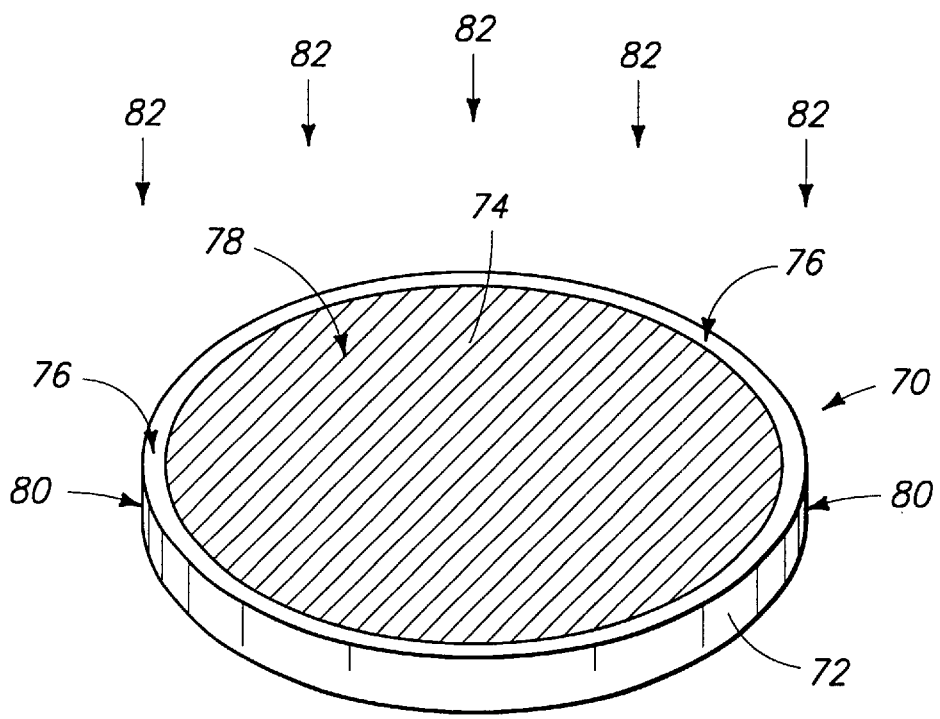
FIG. 6 shows the wafer of FIG. 4 at a processing step subsequent to that of FIG. 5.

Referring to FIG. 6, a dopant 82 is implanted into wafer 70 to dope the unmasked radially outer region 76. Masked radially inner region 78 is prevented from being doped by the photoresist masking layer 74. Dopant 82 preferably comprises a strength-enhancing dopant atom selected from the group consisting of oxygen atoms, germanium atoms, nitrogen atoms and carbon atoms. Further, dopant 82 is preferably implanted to a peak depth of from about 0.3 microns to about 3 microns below an exposed upper surface of region 76. Such implanting can be accomplished by implanting the atoms at an energy of from about 200 keV to about 3000 keV, and at a dose of from $5 \times 10^{14}$ to $1 \times 10^{16}$ atoms/cm$^2$.

Figure 7:
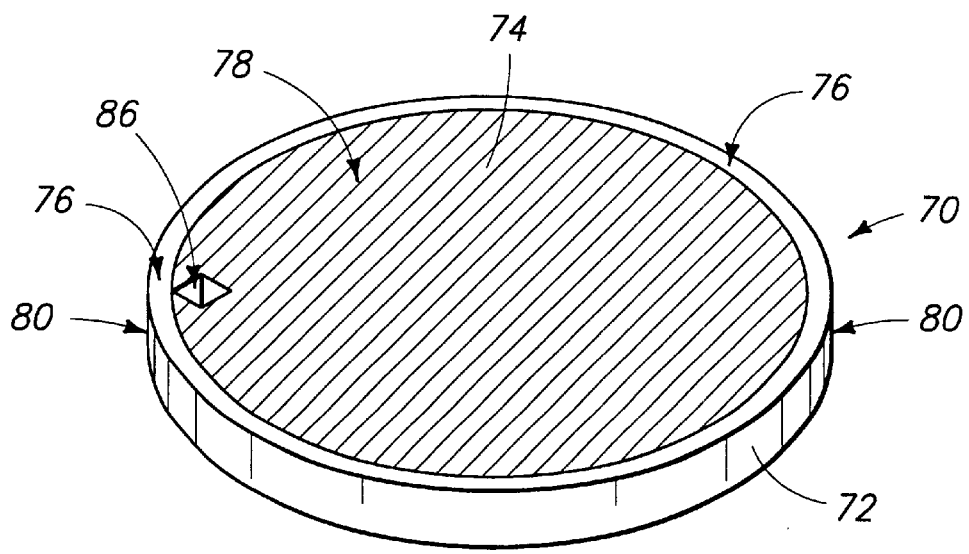
FIG. 7 shows the wafer of FIG. 4 at a processing step subsequent to that of FIG. 6.

Referring next to FIG. 7, a second portion of photoresist layer 74 is removed to expose an alignment portion 86 of semiconductive material wafer 70. Alignment portion 86 is etched to form a trenched alignment marking within wafer 70. Alignment portion 86 can be etched by conventional methods and is typically positioned just inside an outer edge of the photoresist layer 74.

Figure 8:
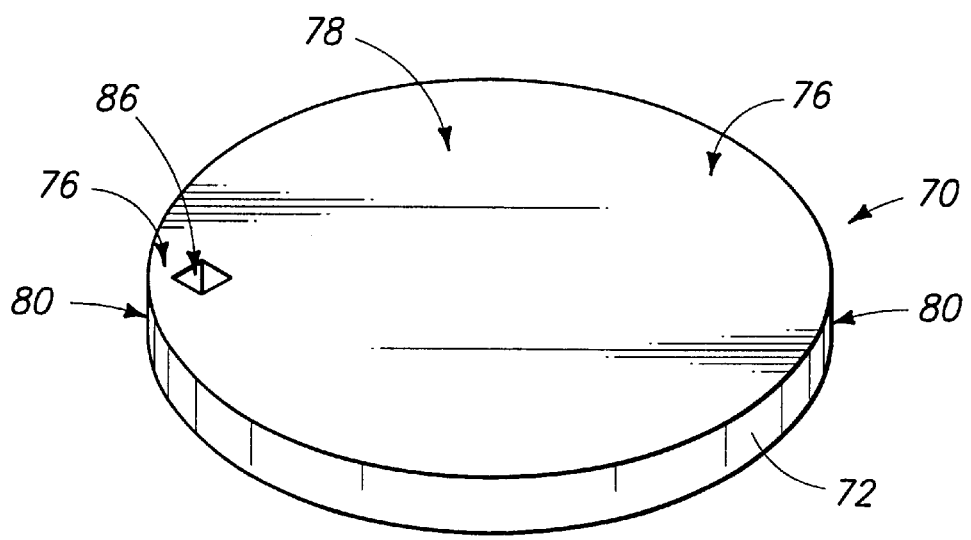
FIG. 8 shows the wafer of FIG. 4 at a processing step subsequent to that of FIG. 7.

Referring to FIG. 8, photoresist layer 74 (shown in FIG. 7) is removed to leave a wafer 70 having an alignment marking at portion 86 and strength-enhancing dopant atoms provided in an outer periphery region 76.

It is noted that the implant of strength-enhancing dopant 82 into wafer 70 can occur at a number of steps other than the shown step of FIG. 6. For instance, although dopant 82 is shown being implanted prior to removal of a second portion of photoresist 74, the invention also encompasses methods in which the dopant is implanted after removing such second portion of photoresist layer 74. Further, although dopant 82 is shown being implanted prior to etching into alignment portion 86 of wafer 70, the invention also encompasses methods in which the dopant is implanted after etching into alignment portion 86.

After the doping of wafer 70 with strength-enhancing dopant 82, wafer 70 is preferably thermally processed to form stacking faults within radially outer region 76. Such thermal processing may comprise, for example, processing doped outer region 76 at a temperature of at least about 800° C. for a time of least about two hours. Preferably, such thermal processing will comprise a temperature of about 1,000° C. for a time of about four hours.

Although the present invention is suitable for forming semiconductive material wafers of many shapes and sizes, the invention is thought to have particular utility for forming relatively large semiconductive material wafers. Accordingly, the invention is thought to be particularly useful for forming wafers that are 300 mm in diameter or larger.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductive material wafer comprising:
    forming an ingot of semiconductive material, said ingot comprising an outer periphery and a portion proximate the outer periphery;
    doping the portion of the ingot proximate the outer periphery with strength-enhancing dopant atoms;
    forming a wafer from the ingot, the wafer comprising the doped portion of the ingot; and
    wherein the doping with the strength-enhancing dopant atoms comprises:
        implanting strength-enhancing dopant atoms from an ion implant source; and
        displacing at least one of the ingot and the ion implant source relative to the other of the ingot and the ion implant source during the implanting.

2. The method of claim 1 wherein the displacement of at least one of the ingot and the ion implant source comprises rotating the ingot relative to the ion implant source.

3. The method of claim 1 wherein the displacement of at least one of the ingot and the ion implant source comprises rotating the ion implant source about the ingot.

4. The method of claim 1 wherein the ingot comprises a longitudinal axis and wherein the displacement of at least one of the ingot and the ion implant source comprises displacing the ion implant source along the longitudinal axis of the ingot.

5. The method of claim 1 wherein the ingot comprises a longitudinal axis and wherein the displacement of at least one of the ingot and the ion implant source comprises displacing the ingot along said longitudinal axis.

6. The method of claim 1 wherein the ingot comprises a longitudinal axis and wherein the displacement of at least one of the ingot and the ion implant source comprises rotating the ingot and displacing the ingot along said longitudinal axis.

7. The method of claim 1 wherein the ingot comprises a longitudinal axis and wherein the displacement of at least one of the ingot and the ion implant source comprises rotating the ion implant source about the ingot and displacing the ion implant source along said longitudinal axis.

8. The method of claim 1 wherein the ingot comprises a longitudinal axis and wherein the displacement of at least one of the ingot and the ion implant source comprises rotating the ion implant source about the ingot and displacing the ingot along said longitudinal axis.

9. The method of claim 1 wherein the ingot comprises a longitudinal axis and wherein the displacement of at least one of the ingot and the ion implant source comprises rotating the ingot and displacing the ion implant source along said longitudinal axis.

10. The method of claim 1 wherein the strength-enhancing dopant atoms are selected from the group consisting of oxygen atoms, germanium atoms, nitrogen atoms and carbon atoms.

11. The method of claim 10 wherein the strength-enhancing dopant atoms are oxygen atoms.

12. The method of claim 10 wherein the strength-enhancing dopant atoms are germanium atoms.

13. The method of claim 10 wherein the strength-enhancing dopant atoms are nitrogen atoms.

14. The method of claim 10 wherein the strength-enhancing dopant atoms are carbon atoms.

15. A method of forming semiconductive material wafers comprising:
dipping a silicon seed crystal into a melted silicon solution;
withdrawing the silicon seed crystal from the melted silicon solution at a sufficiently slow rate that silicon from the melted silicon solution crystallizes on the seed crystal to form a substantially monocrystalline silicon ingot from the seed crystal, the silicon ingot comprising an outer periphery and a longitudinal axis;
doping at least a portion of the outer periphery of the silicon ingot with strength-enhancing dopant atoms, the doping with the strength-enhancing dopant atoms comprising implanting strength-enhancing dopant atoms from an ion implant source and displacing at least one of the ingot and the ion implant source relative to the other of the ingot and the ion implant source, the displacing comprising at least one of rotating the ingot or rotating the ion implant source around the ingot, the displacing further comprising moving at least one of the ingot and the ion implant source along the longitudinal axis of the ingot, the strength enhancing dopant atoms being selected from the group consisting of oxygen atoms, germanium atoms, nitrogen atoms and carbon atoms;
thermal processing of the doped portion of the silicon ingot outer periphery at a temperature of at least about 800° C.; and
cutting of the silicon ingot into wafers.

16. The method of claim 15 wherein the strength-enhancing dopant atoms are oxygen atoms.

17. The method of claim 15 wherein the strength-enhancing dopant atoms are germanium atoms.

18. The method of claim 15 wherein the strength-enhancing dopant atoms are nitrogen atoms.

19. The method of claim 15 wherein the strength-enhancing dopant atoms are carbon atoms.

20. The method of claim 15 wherein the thermal processing comprises a temperature of at least about 1000° C. for a time of at least about 4 hours.

21. A method of treating a monocrystalline silicon wafer to alleviate slip generation and to form alignment markings on the wafer comprising:
providing a monocrystalline silicon wafer;
coating the wafer with photoresist;
removing a first portion of the photoresist with an edge bead removal ring to expose a region of the wafer proximate an edge of the wafer;
removing a second portion of the photoresist to expose an alignment portion of the wafer;
etching the exposed alignment portion of the wafer to form an alignment marking on the wafer; and
implanting a strength-enhancing dopant into the exposed region proximate the edge of the wafer to form a doped region of the wafer.

22. The method of claim 21 wherein the implanting of the strength-enhancing dopant occurs prior to the removing of the second portion of the photoresist.

23. The method of claim 21 wherein the implanting of the strength-enhancing dopant occurs after the removing of the second portion of the photoresist.

24. The method of claim 21 wherein the implanting of the strength-enhancing dopant occurs prior to the etching of the exposed alignment portion of the wafer.

25. The method of claim 21 wherein the implanting of the strength-enhancing dopant occurs after the etching of the exposed alignment portion of the wafer.

* * * * *

UNITED STATES PATENT AND TRADEMARK OFFICE
CERTIFICATE OF CORRECTION

PATENT NO. : 6,267,817
DATED : April 12, 2000
INVENTOR(S) : Fernando Gonzalez

Page 1 of 1

It is certified that error appears in the above-identified patent and that said Letters Patent is hereby corrected as shown below:

<u>Column 3,</u>
Line 46, replace "-consist a essentially of-" with -- consist essentially of --.

Signed and Sealed this

Twelfth Day of March, 2002

Attest:

JAMES E. ROGAN
*Director of the United States Patent and Trademark Office*

*Attesting Officer*